United States Patent [19]

Lin

[11] Patent Number: 6,132,294

[45] Date of Patent: Oct. 17, 2000

[54] METHOD OF ENHANCING SEMICONDUCTOR WAFER RELEASE

[75] Inventor: Chenting Lin, Poughkeepsie, N.Y.

[73] Assignee: Siemens Aktiengesellschaft, Munich, Germany

[21] Appl. No.: 09/161,793

[22] Filed: Sep. 28, 1998

[51] Int. Cl.[7] .................................................. B24B 1/00
[52] U.S. Cl. ................................................. 451/41; 451/56
[58] Field of Search .............................. 451/41, 285, 286, 451/287, 288, 289, 56

[56] References Cited

U.S. PATENT DOCUMENTS

| 5,320,706 | 6/1994 | Blackwell | 451/41 |
|---|---|---|---|
| 5,779,520 | 7/1998 | Hayakawa | 451/41 |
| 5,906,532 | 5/1999 | Nakajima et al. | 451/41 |
| 5,913,712 | 6/1999 | Molinar | 451/41 |

*Primary Examiner*—M. Rachuba
*Attorney, Agent, or Firm*—Donald B. Paschburg

[57] ABSTRACT

In accordance with the present invention, a method is disclosed for releasing semiconductor wafers from a polishing pad. The method includes the steps of applying a slurry to a polishing pad, rotating the polishing pad having slurry thereon while applying pressure against a wafer such that the wafer is polished by the slurry, introducing water to the polishing pad, increasing the rotational speed of the polishing pad to remove a portion of the slurry, decreasing the pressure during the step of increasing rotational speed to substantially prevent further polishing and removing the wafer from the polishing pad.

20 Claims, 3 Drawing Sheets

METHOD OF ENHANCING SEMICONDUCTOR WAFER RELEASE

BACKGROUND

1. Technical Field

This disclosure relates to semiconductor fabrication and more particularly, to an improved method for releasing semiconductor wafers from a polish pad.

2. Description of the Related Art

Semiconductor processing includes polishing semiconductor wafers. Typically, semiconductor polishing includes chemical mechanical polishing or CMP. For polishing, semiconductor wafers are typically placed on a polishing pad. A platen supports the polishing pad during processing. The wafer is placed on the platen having the polishing pad disposed thereon using a mechanical carrier. The platen often provides rotation for polishing the wafer. In addition, the carrier rotates as well. During polishing, a slurry is introduced onto the polishing pad which includes abrasive materials, such as silicon dioxide particles as well as chemicals for etching the surface of the wafer to provide a polished surface on the wafer. The polishing pad includes pores to carry the slurry and distribute the slurry over the wafer.

The slurry or slurries typically used have high viscosities. At the end of polishing, the carrier removes the wafer from the polishing pad to be cleaned or simply unloaded. The slurry viscosity can make the removal of the polishing pad from the wafer difficult since the slurry viscosity causes the polishing pad to stick to the wafer. If the wafer sticks to the polishing pad, this may result in dropping the wafer and cause damage to or even break the wafer. Further, the viscosity of the slurry may cause the wafer to remain in contact with the polishing pad while the carrier attempts to remove it. This may also result in damage to or breakage of the wafer.

Referring to FIG. 1, a carrier 10 is shown for polishing a wafer 12. Wafer 12 is releasably coupled to carrier 10 such that wafer 12 may be removed therefrom without damaging wafer 12. Carrier 10 is moved in the direction of arrow "B" to bring wafer 12 into contact with a polishing pad 14. Polishing pad 14 is disposed on a platen 16. Platen 16 may include a turntable for providing a mechanical polishing motion for polishing wafer 12 as will be described herein.

Referring to FIG. 2, after contacting polishing pad 14, wafer 12 is rotated by carrier 10 as indicated by arrow "A". In addition, platen 16 is rotated in the direction of arrow "C" thereby providing mechanical polishing when abrasives included in slurry 18 are introduced on polishing pad 14. Slurry 18 preferably includes silicon dioxide or aluminum oxide abrasives having a primary particle size of about 100 A an up. Slurry 18 is introduced gradually from a slurry feed 20 onto polishing pad 14. A pressure P is applied to carrier 10 to provide a normal force to assist in polishing wafer 12.

Referring to FIG. 3, toward the end of the polish, slurry 18 is no longer introduced to polishing pad 14. A water polish step is introduced in which water 22 is introduced onto polishing pad 14. Depending on slurry viscosity, platen 16 is rotated in the direction of arrow "C" at a rate of about 50 rpm's for about 1–60 seconds prior to carrier 10 separating wafer 12 from pad 14. However, slurries usually have a high viscosity and the introduction of water is not sufficient to provide adequate separation from polishing pad 14.

Damage to the wafer reduces throughput, and any delay in cleaning the wafer which may result due the difficulty in removing the wafer from the polishing pad may also result in a reduction of wafer yield. Therefore, a need exists for a method for enhancing wafer release from a polish pad after a polishing step.

SUMMARY OF THE INVENTION

In accordance with the present invention, a method is disclosed for releasing semiconductor wafers from a polishing pad. The method includes the steps of applying a slurry to a polishing pad, rotating the polishing pad having slurry thereon while applying pressure against a wafer such that the wafer is polished by the slurry, introducing water to the polishing pad, increasing the rotational speed of the polishing pad to remove a portion of the slurry, decreasing the pressure, which may include reducing a back pressure of the wafer by applying a vacuum pressure thereto, during the step of increasing rotational speed to substantially prevent further polishing and removing the wafer from the polishing pad.

Another method is disclosed for releasing semiconductor wafers from a polishing pad including the steps of releasably securing a semiconductor wafer to a carrier, applying a slurry to a polishing pad, rotating the carrier and the wafer while applying pressure to the wafer against the polishing pad having slurry thereon such that the wafer is polished by the slurry, rotating the polishing pad such that the wafer is further polished by the slurry, introducing water to the polishing pad to end polishing, increasing the rotational speed of the wafer and the polishing pad to remove a portion of the slurry, decreasing the pressure, which may include reducing a back pressure of the wafer by applying a vacuum pressure thereto, of the wafer against the polishing pad during the step of increasing rotational speed to substantially prevent further polishing and releasing the wafer from the polishing pad by lifting the carrier.

In alternate methods, the step of rotating the polishing pad while applying pressure may include the step of rotating the polishing pad at a rate of about 20 to about 100 rotations per minute. The step of rotating the polishing pad while applying pressure may include the step of applying a pressure of between about 2 to 8 psi between the wafer and the polishing pad. The step of introducing water to the polishing pad may include the step of discontinuing the slurry to the polishing pad. The step of increasing the rotational speed of the polishing pad to remove a portion of the slurry may include the step of increasing the rotational speed of the polishing pad by between about 1.1 times to about 3 times. The step of increasing the rotational speed of the polishing pad to remove a portion of the slurry may include the step of increasing the rotational speed of the polishing pad to between about 22 rotations per minute to about 300 rotations per minute. The step of decreasing the pressure may include the step of decreasing the pressure to between about 0 to about 3 psi, preferably substantially zero psi. The may include the step of introducing a surfactant to the polishing pad to separate the slurry.

In still other methods, the wafer and the polishing pad may both be rotated and the step of increasing the rotational speed of the wafer and the polishing pad by between about 1.1 times to about 3 times may be included. The step of increasing the rotational speed of the wafer and the polishing pad to remove a portion of the slurry includes the step of increasing the rotational speed of the wafer to between about 22 rotations per minute to about 300 rotations per minute. The step of increasing the rotational speed of the wafer and the polishing pad to remove a portion of the slurry may include the step of increasing the rotational speed of the polishing pad to between about 22 rotations per minute to about 300 rotations per minute.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to method of enhancing release of a semiconductor wafer from a polish pad after a polishing step. The present invention provides a method for improving throughput and wafer yield based on a polish step introduced at the end of polishing a wafer. The polishing step includes water polishing prior to the removal of the wafer from the polish pad. Further, for slurries with high viscosities, an additional step is included which provides for an increase platen or turntable rotation rate and a smaller normal force exerted by the carrier. In this way, the present invention provides a more easily removed wafer resulting in increased throughput and wafer yield by preventing damage to the wafer and reducing the amount of delay prior to cleaning the wafer.

Figure 1:
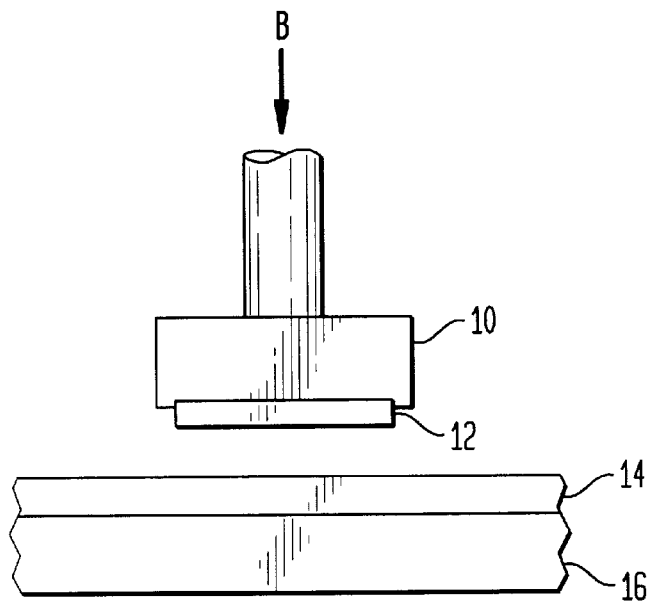
FIG. 1 is a side view of a semiconductor wafer installed on a carrier and elevated form a polishing pad in accordance with the prior art.
Figure 2:
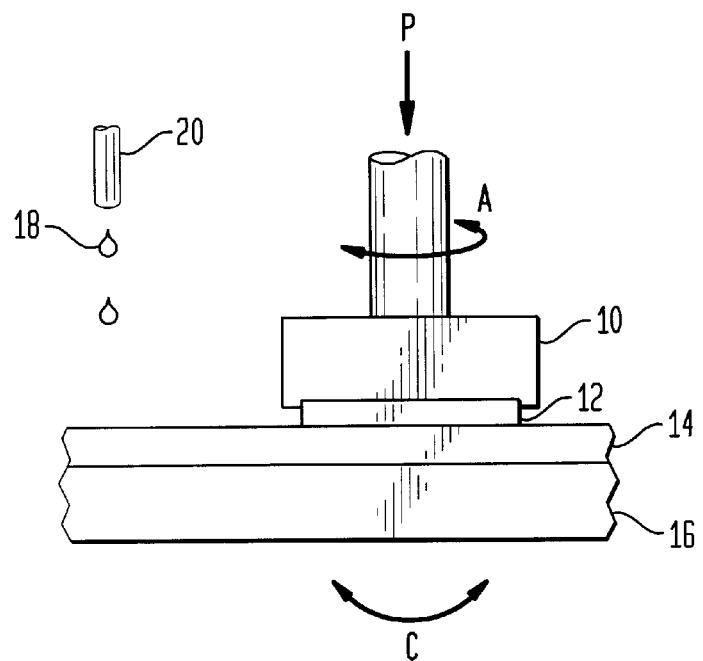
FIG. 2 is a side view of the semiconductor wafer and carrier of FIG. 1 showing the wafer in contact with the polishing pad having slurry disposed thereon in accordance with the prior art.
Figure 3:
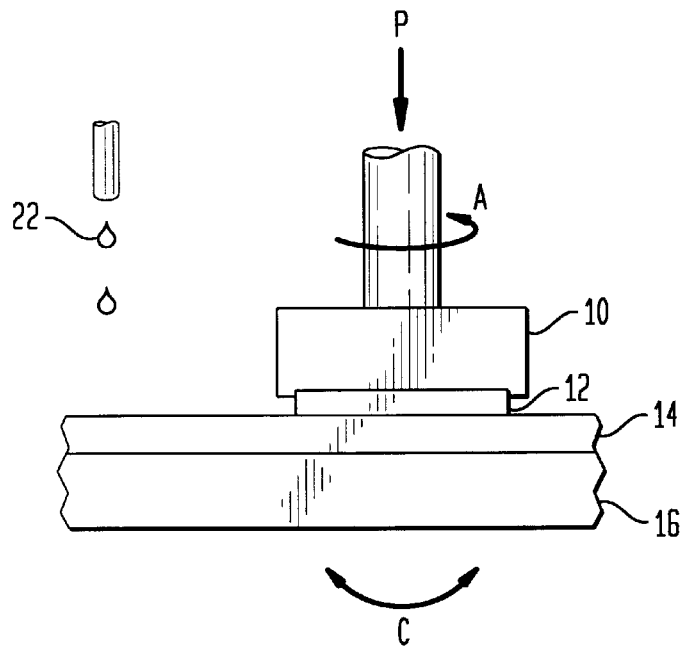
FIG. 3 is a side view of the semiconductor wafer and carrier of FIG. 1 showing the wafer in contact with the polishing pad having water introduced thereon in accordance with the prior art.
Figure 4:
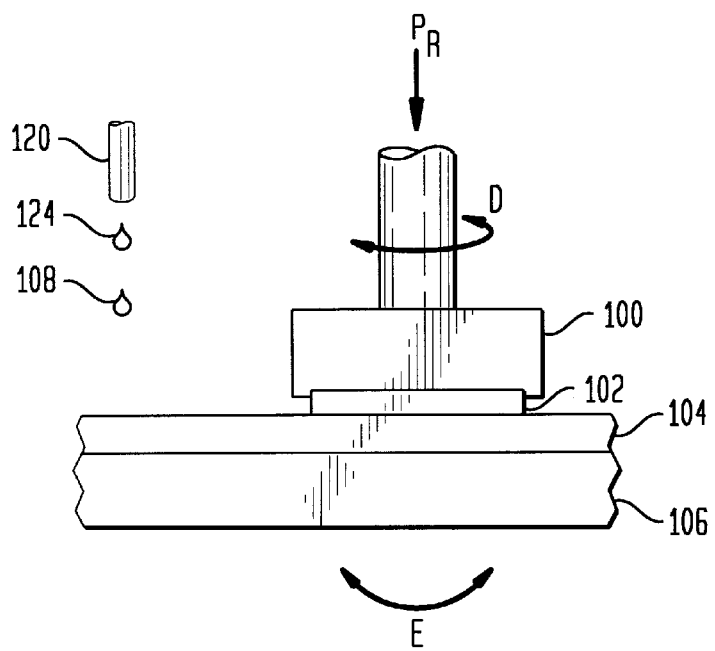
FIG. 4 is a side view of a semiconductor wafer and a carrier showing the wafer in contact with a polishing pad and water introduced on the polishing pad in accordance with the present invention.

Referring now in specific detail to the drawings in which like reference numerals identify similar or identical elements throughout the several views, and initially to FIG. 4, a carrier 100 is shown for polishing a wafer 102. Wafer 102 is preferably a semiconductor wafer having functional devices formed thereon or being fabricated thereon. Wafer 102 is releasably coupled to carrier 100 such that wafer 102 may be removed therefrom without damaging wafer 102. Polishing of wafer 102 is conducted as described above with reference to FIGS. 1 and 2. During polishing, wafer 102 is in contact with a polishing pad 104 which is disposed on a platen 106. Platen 106 may include a turntable for providing a mechanical polishing motion for polishing wafer 102. As described above, wafer 102 is rotated by carrier 100 as indicated by arrow "D". In addition, platen 106 is rotated in the direction of arrow "E" thereby providing mechanical polishing when abrasives included in a slurry 108 are introduced on polishing pad 104. Slurry 108 preferably includes silicon dioxide or aluminum oxide abrasives having a primary particle size of 100 A and greater. Other slurries may also be useful.

Slurry 108 is introduced gradually from a slurry feed 120 onto polishing pad 104. A pressure $P_R$ is applied to carrier 100 to provide a normal force to assist in polishing wafer 102. When a predetermined depth is polished from the surface of wafer 102, a water polishing process is performed to remove slurry and end the polishing.

A water polishing process in accordance with the present invention cuts off slurry 108 and instead introduces water 124. Since slurries are often too viscous to permit proper separation for wafer 102 from polishing pad 104 by carrier 100, the turntable rate of platen 106 is increased by about 1.1 times to about 3 times, i.e., to between about 22 rpm to about 300 rpm. This is performed during the water polishing step described above to separate the slurry and remove the slurry from the wafer. In preferred embodiments, the turntable rate of platen 106 is increased to above 100 rpm. A force provided by pressure $P_R$ may also be reduced in conjunction with the increase in speed of the turntable of platen 106 as described in further detail below. In addition, carrier 100 may be increased in rotational speed to further remove slurry during the water polishing process. In a preferred embodiment, carrier 100 rotates at the a rate about equal to the increased rate of the turntable, i.e., about 1.1 times to about 3 times, for example, between about 22 rpm to about 300 rpm.

The combined effect of increased rotational speed and reduced normal force, provides a wafer 102 which is more easily removed from polishing pad 104. The centrifugal force induced by the increased rotation rate of the turntable assists in removing residual slurry left behind during water polishing. Further, the reduced downward force prevents excessive residual polishing during the water polishing step. In a preferred embodiment, pressure $P_R$ is reduced to between about 0 to about 3 psi, more preferably 0 psi.

A surfactant such as alcohol, or isopropanol may be introduced through slurry feed 122 to further separate slurry 118 from polishing pad 104. The surfactant may be introduced prior to or during the water polishing process.

Figure 5:
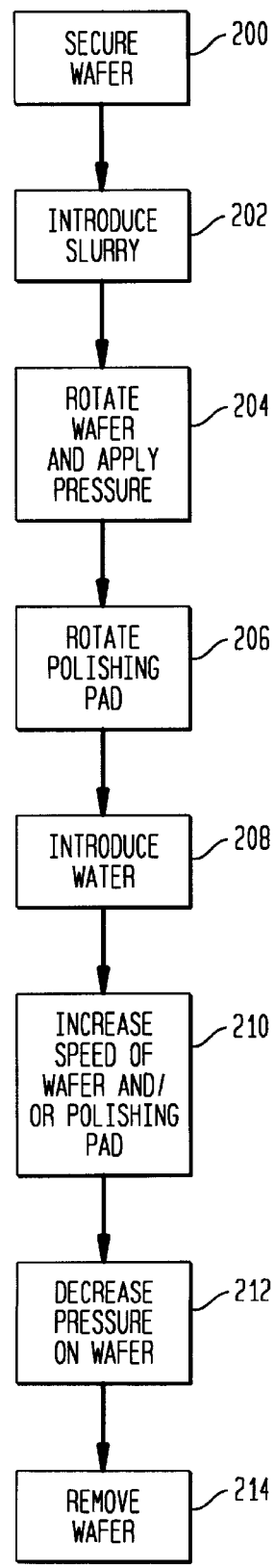
FIG. 5 is a flow diagram of a method in accordance with the present invention.

Referring to FIG. 5, a flow diagram is shown for the method of releasing a wafer from a polishing pad in accordance with the present invention. A method for releasing semiconductor wafers from a polishing pad includes releasably securing a semiconductor wafer to a carrier in block 200. A slurry is introduced to a polishing pad through a slurry feed in block 202. The carrier and, therefore, the wafer, is rotated while applying pressure to the wafer against the polishing pad in block 204. The polishing pad includes pores for carrying the slurry such that the wafer is polished by the slurry when the polishing pad moves relative to the wafer. The polishing pad may rotated in addition to the rotation of the carrier to further polish the wafer in block 206. In block 208, water is introduced to the polishing pad to end the polishing process. In block 210, the rotational speed of the wafer and/or the polishing pad is increased to remove a portion of the slurry. In block 212, the pressure of the wafer against the polishing pad is decreased during the step of block 210 to substantially prevent further polishing of the wafer. The wafer is released from the polishing pad by lifting the carrier in block 214. The carrier preferably includes a vacuum port and the wafer is sealed to the carrier. In this way, a vacuum pressure or back pressure is applied to the backside of the wafer through the vacuum port thereby assisting in lifting the wafer with the carrier.

In accordance with the present invention, polishing slurries are removed and/or reduced in viscosity thereby enhancing the release of a wafer from a polishing pad during processing. When unloading or cleaning is to be performed on the wafer in accordance with the invention, there is a substantially reduced risk of dropping the wafer or leaving the wafer behind on the polishing pad. This reduced potential damage and/or breakage of the wafer thereby increasing throughput and wafer yield.

Having described preferred embodiments for a novel method of enhancing semiconductor wafer release (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for processing semiconductor wafers, comprising the steps of:

applying a slurry to a polishing pad;

rotating the polishing pad having slurry thereon while applying pressure against a wafer such that the wafer is polished by the slurry;

introducing water to the polishing pad;

increasing the rotational speed of the polishing pad to remove a portion of the slurry;

decreasing the pressure during the step of increasing rotational speed to substantially prevent further polishing; and removing the wafer from the polishing pad.

2. The method as recited in claim 1, wherein the step of rotating the polishing pad while applying pressure includes the step of rotating the polishing pad at a rate of between about 20 to about 100 rotations per minute.

3. The method as recited in claim 1, wherein the step of rotating the polishing pad while applying pressure includes the step of applying a pressure of about 2 psi to about 8 psi between the wafer and the polishing pad.

4. The method as recited in claim 1, wherein the step of introducing water to the polishing pad includes the step of discontinuing the slurry to the polishing pad.

5. The method as recited in claim 1, wherein the step of rotating the polishing pad includes rotating the polishing pad at a first speed and the step of increasing the rotational speed of the polishing pad to remove a portion of the slurry includes increasing the rotational speed of the polishing pad by between about 1.1 times to about 3 times the first speed.

6. The method as recited in claim 1, wherein the step of increasing the rotational speed of the polishing pad to remove a portion of the slurry includes the step of increasing the rotational speed of the polishing pad to between about 22 rotations per minute to about 300 rotations per minute.

7. The method as recited in claim 1, wherein the step of decreasing the pressure includes the step of decreasing the pressure to between about 0 psi to about 3 psi.

8. The method as recited in claim 1, wherein the step of decreasing the pressure includes the step of decreasing the pressure to substantially zero.

9. The method as recited in claim I, further comprises the step of introducing a surfactant to the polishing pad to separate the slurry.

10. A method for processing semiconductor wafers, comprising the steps of:

releasably securing a semiconductor wafer to a carrier;

applying a slurry to a polishing pad;

rotating the carrier and the wafer while applying pressure to the wafer against the polishing pad having slurry thereon such that the wafer is polished by the slurry;

rotating the polishing pad such that the wafer is further polished by the slurry;

introducing water to the polishing pad to end polishing;

increasing the rotational speed of the wafer and the polishing pad to remove a portion of the slurry;

decreasing the pressure of the wafer against the polishing pad during the step of increasing rotational speed to substantially prevent further polishing; and releasing the wafer from the polishing pad by lifting the carrier.

11. The method as recited in claim 10, wherein the step of rotating the carrier and the wafer while applying pressure includes the step of rotating the wafer at a rate of between about 20 to about 100 rotations per minute.

12. The method as recited in claim 10, wherein the step of rotating the carrier and the wafer while applying pressure includes the step of applying a pressure of about 2 psi to about 8 psi between the wafer and the polishing pad.

13. The method as recited in claim 10, wherein the step of introducing water to the polishing pad includes the step of discontinuing the slurry to the polishing pad.

14. The method as recited in claim 10, wherein the step of rotating the carrier and the wafer includes rotating the wafer at a first speed and the step of increasing the rotational speed of the wafer and the polishing pad to remove a portion of the slurry includes increasing the rotational speed of the wafer by between about 1.1 times to about 3 times the first speed.

15. The method as recited in claim 14, wherein the step of rotating the polishing pad includes rotating the polishing pad at the first speed and the step of increasing the rotational speed of the wafer and the polishing pad to remove a portion of the slurry includes increasing the rotational speed of the polishing pad by between about 1.1 times to about 3 times the first speed.

16. The method as recited in claim 10, wherein the step of increasing the rotational speed of the wafer and the polishing pad to remove a portion of the slurry includes the step of increasing the rotational speed of the wafer to between about 22 rotations per minute to about 300 rotations per minute.

17. The method as recited in claim 16, wherein the step of increasing the rotational speed of the wafer and the polishing pad to remove a portion of the slurry includes the step of increasing the rotational speed of the polishing pad to between about 22 rotations per minute to about 300 rotations per minute.

18. The method as recited in claim 10, wherein the step of decreasing the pressure includes the step of decreasing the pressure to between about 0 psi to about 3 psi.

19. The method as recited in claim 10, wherein the step of decreasing the pressure includes the step of decreasing the pressure to substantially zero.

20. The method as recited in claim 10, further comprises the step of introducing a surfactant to the polishing pad to separate the slurry.

* * * * *